(12) United States Patent
Shioga et al.

(10) Patent No.: US 8,474,126 B2
(45) Date of Patent: Jul. 2, 2013

(54) MANUFACTURING METHOD OF SEMICONDUCTOR DEVICE

(75) Inventors: Takeshi Shioga, Kawasaki (JP); Kazuaki Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/206,042

(22) Filed: Aug. 9, 2011

(65) Prior Publication Data

US 2011/0294265 A1 Dec. 1, 2011

Related U.S. Application Data

(62) Division of application No. 12/114,298, filed on May 2, 2008, now Pat. No. 8,035,981.

(30) Foreign Application Priority Data

Aug. 31, 2007 (JP) ................................ 2007-226592

(51) Int. Cl.
*H01S 4/00* (2006.01)

(52) U.S. Cl.
USPC ............. 29/592.1; 29/25.42; 29/832; 29/840; 361/782; 361/766

(58) Field of Classification Search
USPC ................. 29/592.1, 594–595, 25.41–25.42, 29/832–842, 874, 884; 361/782, 766
See application file for complete search history.

(56) References Cited

U.S. PATENT DOCUMENTS

| | | | |
|---|---|---|---|
| 4,631,633 A * | 12/1986 | Shaulov et al. ............ 361/321.5 |
| 5,019,949 A | 5/1991 | Ikeda et al. |
| 6,222,260 B1 | 4/2001 | Liang et al. |
| 6,243,256 B1 | 6/2001 | Furuta et al. |
| 6,489,572 B2 * | 12/2002 | Ho et al. ........................ 174/259 |
| 6,787,926 B2 | 9/2004 | Chen et al. |
| 6,973,035 B2 | 12/2005 | Seddigh et al. |
| 7,268,997 B2 | 9/2007 | Saitou et al. |
| 8,035,981 B2 * | 10/2011 | Shioga et al. ................. 361/782 |
| 2004/0041249 A1 * | 3/2004 | Tsai et al. ..................... 257/686 |
| 2004/0183170 A1 | 9/2004 | Tomimatsu |
| 2005/0135041 A1 | 6/2005 | Kang et al. |
| 2005/0213282 A1 | 9/2005 | Kondo et al. |
| 2007/0054438 A1 | 3/2007 | Huang et al. |
| 2007/0159771 A1 | 7/2007 | Saito et al. |

FOREIGN PATENT DOCUMENTS

| | | |
|---|---|---|
| JP | 7-176453 A | 7/1995 |
| JP | 10-097952 A | 4/1998 |
| JP | 11-097952 A | 4/1999 |
| JP | 2003-197463 A | 7/2003 |
| JP | 2006-254427 A | 9/2006 |
| JP | 2006-265591 A | 10/2006 |

* cited by examiner

*Primary Examiner* — Minh Trinh
(74) *Attorney, Agent, or Firm* — Westerman, Hattori, Daniels & Adrian, LLP

(57) ABSTRACT

A manufacturing method of a semiconductor device include forming a capacitor by forming an oxide film on a surface of a valve metal based on anodic oxidization and by forming a conductive part made of a conductive material on the oxide film; adhering the capacitor on a semiconductor element mounted on a supporting substrate; and coupling the capacitor to the supporting substrate via an outside connection terminal.

4 Claims, 10 Drawing Sheets

MANUFACTURING METHOD OF SEMICONDUCTOR DEVICE

CROSS-REFERENCE TO RELATED CASES

This application is a divisional of U.S. application Ser. No. 12/113,298, which was filed on May 2, 2008 now U.S. Pat. No. 8,035,981 based upon and claiming priority from Japanese Patent Application No. 2007-226592 filed on Aug. 31, 2008, the entirety of which is incorporated herein by reference, and which has been matured into a U.S. Pat. No. 8,035,981 under the title of "SEMICONDUCTOR DEVICE AND MANUFACTURING METHOD OF THE SAME"

BACKGROUND

1. Field

The present invention generally relates to semiconductor devices and manufacturing methods of the same. More specifically, the present invention relates to a semiconductor device wherein a capacitor is provided in the vicinity of a semiconductor device used for an electronic apparatus such as a computer, the capacitor contributing to stable operations in a high frequency area of the semiconductor device, and a manufacturing method of the semiconductor device.

2. Description of the Related Art

In recent years, a technology such as a CoC (Chip on Chip) technology where a storage element and a logic circuit element are mounted in a single package so that high speed signal transmission of several Gbps is made between the elements has been suggested. Here, a large capacity DRAM (Dynamic Random Access Memory), a flash memory, or the like corresponds to the storage element. A microprocessor or the like corresponds to the logic circuit element.

FIG. 1 shows an example where plural semiconductor elements are mounted on a single interposer substrate.

Referring to FIG. 1, in a semiconductor device 10, a first semiconductor element 2 as a storage element and a second semiconductor element 3 as a logic circuit element are mounted on an interposer substrate 1 in a face-down manner by a flip chip method.

The interposer substrate 1 may be called a supporting substrate. The interposer substrate 1 includes a multi-layer fine wiring structure 7 and electrode pads 8. The multi-layer fine wiring structure 7 is formed by stacking plural wiring layers 6 made of copper (Cu) or the like on an upper surface of a silicon (Si) substrate 4 via insulation films (layers) 5 made of polyimide or the like.

In the multi-layer fine wiring structure 7, via posts 9 made of copper (Cu) are formed. The positions of the via posts 9 correspond to the positions of the electrode pads 8. Each electrode pad 8 is formed by the following method. That is, titanium (Ti) and copper (Cu) are formed into a film by sputtering deposition. Nickel (Ni) is plated by using the sputtering film made of titanium (Ti) and copper (Cu) as a seed layer so that the electrode pad 8 is formed.

On the other hand, the first semiconductor element 2 and the second semiconductor element 3 are semiconductor integrated circuit elements using silicon (Si) semiconductor substrates and formed by known semiconductor manufacturing processes. Plural outside connection pads 11 and 12 made of aluminum (Al), copper (Cu), and alloys of these metals are formed on main surfaces of the semiconductor substrates.

The electrode pads 8 of the interposer substrate 1 are coupled to the outside connection pads 11 and 12 of the first semiconductor element 2 and the second semiconductor element 3 via micro bumps 13 discussed below. The micro bump 13 is a convex shaped outside connection terminal made of, for example, solder.

Here, illustrations of active elements and/or passive elements formed in the silicon semiconductor substrates of the first semiconductor element 2 and the second semiconductor element 3 and multi layer wiring layers and/or rewiring layers formed on main surfaces of the silicon semiconductor substrates are omitted in FIG. 1.

An underfill material 14 whose main ingredient is epoxy resin is supplied between the first semiconductor element 2 and the second semiconductor element 3 and the interposer substrate 1 so that connection between the first semiconductor element 2 and the second semiconductor element 3 and the interposer substrate 1 is reinforced.

Electrode pads 15 coupled to the multi layer micro wiring structure 7 are provided outside the electrode pads 8 in the upper surface of the interposer substrate 1. Bonding wires 16 which are coupled to a package substrate (not shown in FIG. 1) are coupled to the electrode pads 15.

Thus, in the semiconductor device 10, on the single interposer substrate 1, the first semiconductor element 2 as the storage element and the second semiconductor element 3 as the logic circuit element are coupled to each other by using the micro bumps 13. Accordingly, bit width can be widened and high speed data signal transmission can be performed by increasing the number of the micro bumps 13, namely the number of connections between the semiconductor element 2 and the second semiconductor element 3.

In the above-discussed semiconductor device 10, a structure shown in FIG. 2 is suggested as an example where electric power is supplied to or an electric power source is decoupled from the first semiconductor element 2 or the second semiconductor element 3.

In FIG. 2, parts that are the same as the parts shown in FIG. 1 are given the same reference numerals, and explanation thereof is omitted. For the convenience of explanation, only the first semiconductor element 2 is illustrated as a semiconductor element mounted on the main surface of the interposer substrate 1 and illustration of the second semiconductor element 3 is omitted. In addition, detailed illustration of the multi layer micro wiring structure 7 of the interposer substrate 1 is omitted.

In a semiconductor device 20, electrode pads 66 formed by a method the same as that for the electrode pads 8 (see FIG. 1) are provided outside of the first semiconductor element 2 on a main surface of the interposer substrate 1 opposite to the surface where the first semiconductor element 2 is mounted. The electrode pads 66 as well as the electrode pads 8 (see FIG. 1) are coupled to the multi layer micro wiring structure 7. In addition, solder bumps 17 as convex shaped outside connection terminals made of solder or the like are provided on the electrode pads 66.

Plural chip capacitors 21 and 22 are mounted at a part, corresponding to a part where the first semiconductor element 2 is formed, on the main surface of the interposer substrate 1 where the electrode pads 66 are formed.

More specifically, plural micro bump electrode pads 23 are formed at a part, corresponding to a part where the first semiconductor element 2 is formed, on the main surface of the interposer substrate 1 where the electrode pads 66 are formed. Plural micro bump electrode pads 24 are formed on a main surface of the chip capacitors 21 facing the interposer substrate 1. The micro bump electrode pads 23 of the interposer substrate 1 and the micro bump electrode pads 24 of the chip capacitors 21 are coupled to each other by the micro bumps 25.

The chip capacitors 22 are coupled to the interposer substrate 1 by solder material 26.

Under this structure, electric power is supplied to or an electric power source is decoupled from the first semiconductor element 2.

Japanese Patent Application Laid-Open Publication No. 7-176453 discusses a structure where a decoupling capacitor is provided in an interposer substrate, the capacitor is arranged right under an LSI element, and the length of a wiring from a ground line and an electric power supply of the LSI element to the capacitor is shortest, so that inductance is reduced.

In addition, Japanese Patent Application Laid-Open Publication No. 10-97952 discusses that a capacitor where an anodic oxide film formed on a single surface of an aluminum foil and used as a capacitor dielectric is formed as an internal layer of a printed wiring board.

Furthermore, Japanese Patent Application Laid-Open Publication No. 2003-197463 describes a thin film capacitor where a dielectric layer is made thin in order to increase capacitor capacitance. This thin film capacitor is manufactured by a thin film process whereby a metal electrode layer and a dielectric oxide layer are stacked on a supporting substrate by using a vacuum apparatus. Since a micro process of the thin film can be done by dry etching, it is possible to realize low impedance.

Thus, in order to stabilize fluctuation in an electric power source line to the semiconductor element mounted on the interposer substrate, a decoupling capacitor such as a multilayer chip capacitor is provided. However, in a case where a large number of the semiconductor elements are mounted on the interposer substrate, the capacitance required for the decoupling capacitor may be increased. Hence, the number of the capacitors mounted on the package substrate or the interposer substrate is increased.

Accordingly, it is difficult to secure an effective mounting space for the decoupling capacitors.

In addition, in an example where the decoupling capacitor is provided in the interposer substrate as discussed in Japanese Patent Application Laid-Open Publication No. 7-176453 and Japanese Patent Application Laid-Open Publication No. 10-97952, it is possible to shorten the length of the wiring from the semiconductor element to the capacitor. However, a through via forming part should be formed in the interposer substrate in order to manufacture the interposer substrate where the capacitor is provided. In other words, it is necessary to form the through hole by a process for simultaneously burning a conducting material and ceramic material or forming the through hole in silicon forming the interposer substrate, applying an insulation process between the via forming parts, and supplying the conductor.

Furthermore, in the example discussed in Japanese Patent Application Laid-Open Publication No. 2003-197463, for forming the capacitor, it is general practice to provide a noble metal material such as platinum (Pt) or gold (Au), which is difficult to be oxidized, as an electrode material of the thin film capacitor. In addition, it is necessary, for the purpose of deposition of the high dielectric material, to apply a vacuum apparatus such as a sputtering apparatus and take measures for removing particles in order to improve yield rate.

Thus, it is difficult to manufacture a semiconductor device at low cost in any way.

SUMMARY

One aspect of the present invention may be to provide a semiconductor device, including a semiconductor element, a supporting substrate where the semiconductor element is mounted, and a capacitor provided on the semiconductor element and coupled to the supporting substrate via an outside connection terminal, wherein the capacitor includes a valve metal part, an anodic oxide film formed on a surface of the valve metal part, and a conductive part formed on the anodic oxide film and made of a conductive material.

Another aspect of the present invention may be to provide a manufacturing method of a semiconductor device, including, forming a capacitor by forming an oxide film on a surface of a valve metal based on anodic oxidization and by forming a conductive part made of a conductive material on the oxide film, adhering the capacitor on a semiconductor element mounted on a supporting substrate, and coupling the capacitor to the supporting substrate via an outside connection terminal.

DETAILED DESCRIPTION OF THE PREFERRED EMBODIMENTS

A description is given below, with reference to the FIG. 3 through FIG. 11 of embodiments of the present invention.

First, a structure of a semiconductor device of an embodiment is disclosed and then a manufacturing method of the semiconductor device is disclosed.

1. Semiconductor Device

Figure 1:
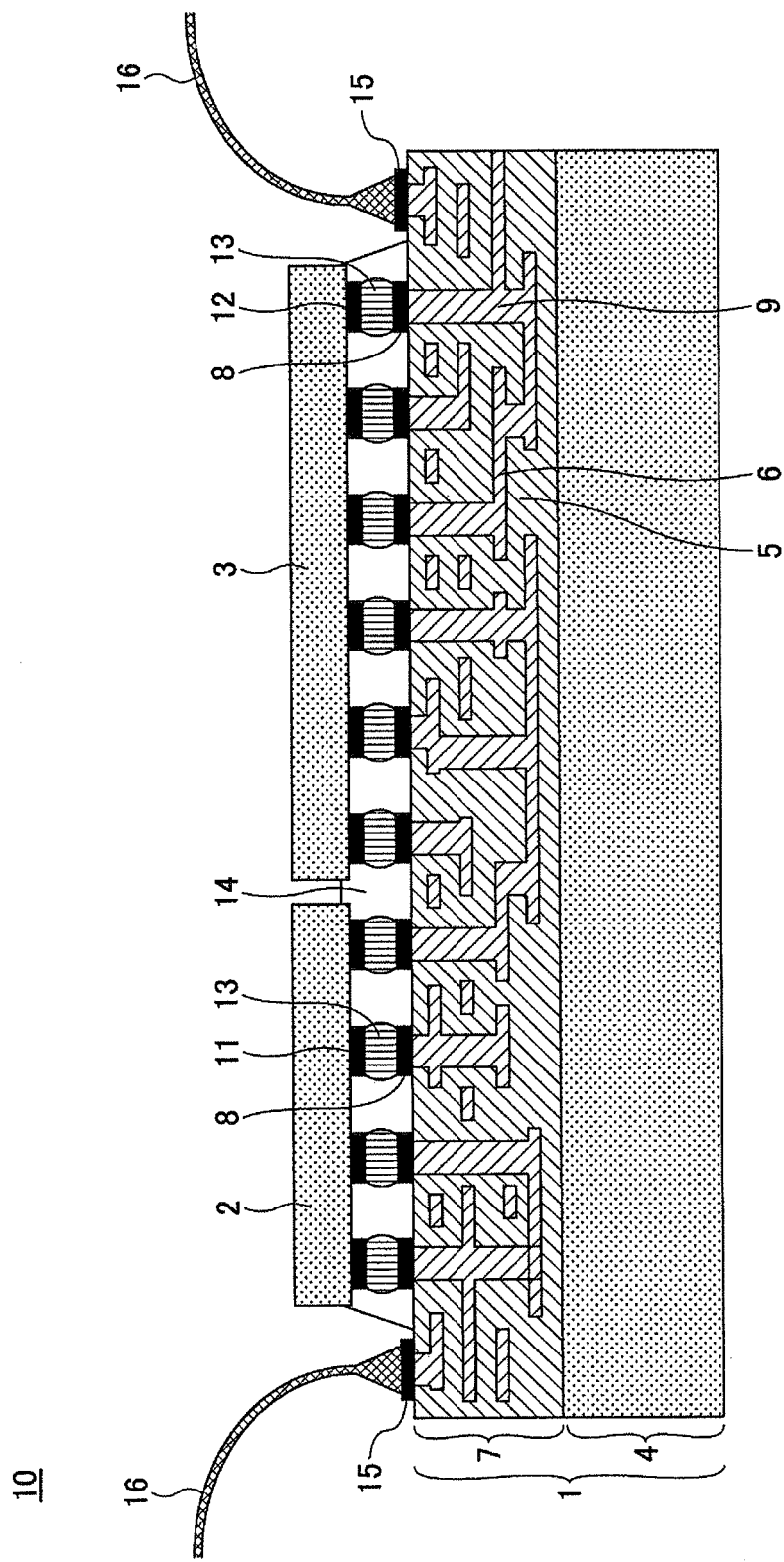
FIG. 1 is a cross-sectional view showing an example where plural semiconductor elements are mounted on a single interposer substrate.
Figure 2:
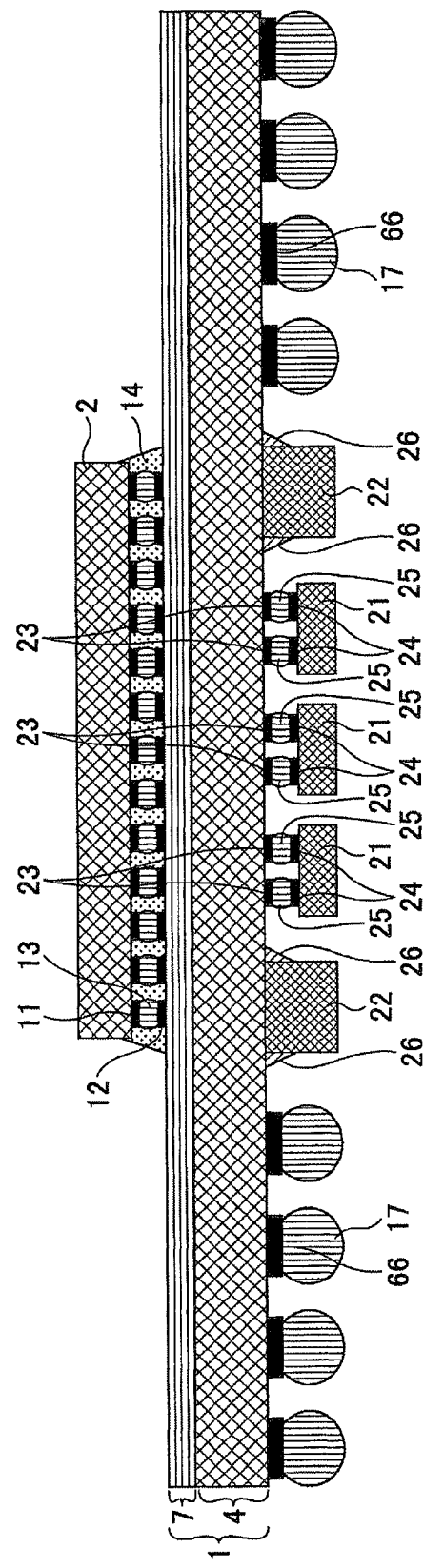
FIG. 2 is a cross-sectional view for explaining an example where electric power is supplied to the semiconductor device or electric power decoupling is done to the semiconductor device.
Figure 3:
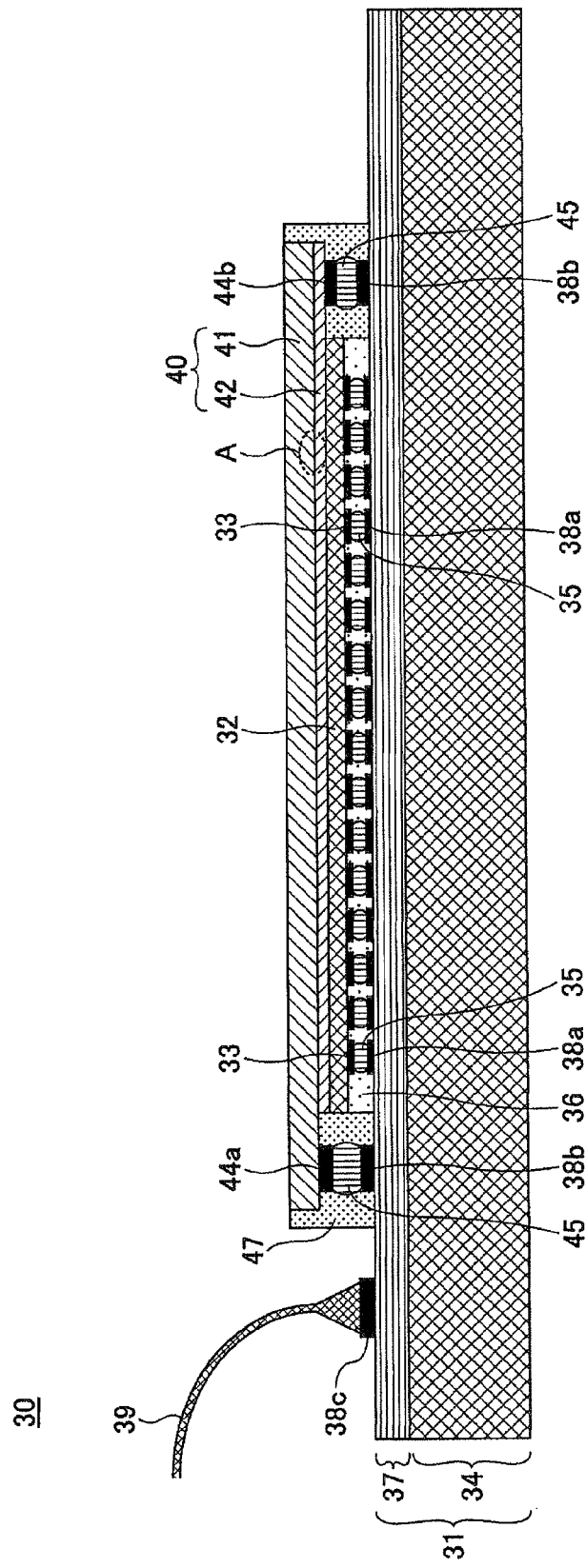
FIG. 3 is a cross-sectional view of a semiconductor device of an embodiment.

FIG. 3 is a cross-sectional view of a semiconductor device of an embodiment.

Referring to FIG. 3, in a semiconductor device 30 of the embodiment, a semiconductor element 32 is mounted on an interposer substrate 31 in a face-down manner by a flip chip method.

The interposer substrate 31 may be called a supporting substrate. The interposer substrate 31 includes a multi-layer fine wiring structure 37 and electrode pads 38. The multi-layer fine wiring structure 37 is formed by stacking plural layers made of copper (Cu) or the like on a silicon (Si) substrate 34 via insulation films (layers) made of polyimide or the like. The electrode pads 38 are coupled to the above-mentioned multi-layer fine wiring structure 37. In FIG. 3, detailed illustration of the multi-layer fine wiring structure 37 of the interposer substrate 31 is omitted.

Each electrode pad 38 is formed by the following method. That is, titanium (Ti) and copper (Cu) are formed into a film by sputtering deposition. Nickel (Ni) is plated by using the sputtering film made of titanium (Ti) and copper (Cu) as a seed layer so that the electrode pad 38 is formed.

Plural electrode pads 38a are provided at a center part of an upper surface of the interposer substrate 31. The electrode pads 38a are coupled to outside connection pads 33 of a semiconductor element 32 via fine pitch micro bumps 35 discussed below. Plural electrode pads 38b are provided outside of the electrode pads 38a on the upper surface of the interposer substrate 31. The electrode pads 38b are coupled to electrode pads 44 of a conductive polymer capacitor 40 via solder bumps 45 as convex shaped outside connection terminals. An electrode pad 38c is provided outside the electrode pads 38b. A bonding wire 39 which is coupled to a package substrate (not shown in FIG. 3) is coupled to the electrode pad 38c.

On the other hand, the semiconductor element 32 is a semiconductor integrated circuit element using a silicon (Si) semiconductor substrate and formed by known semiconductor manufacturing processes. Plural outside connection pads 33 made of aluminum (Al), copper (Cu), and alloys of these metals are formed on a main surface of the semiconductor substrate.

Here, illustrations of active elements and/or passive elements formed in the silicon semiconductor substrate of the semiconductor element 32 and multi layer wiring layers and/or rewiring layers formed on main surfaces of the silicon semiconductor substrate are omitted in FIG. 3.

Fine pitch micro bumps 35 which are convex shaped outside connection terminals made of, for example, solder are provided between the outside connection pads 33 of the semiconductor element 32 and the electrode pads 38a of the interposer substrate 31. The micro bumps 35 with, for example, 40 μm thickness are provided between the outside connection pads 33 of the semiconductor element 32 and the electrode pads 38a of the interposer substrate 31.

A plane-shaped (sheet) conductive polymer capacitor 40 is provided on a main surface of the semiconductor element 32 situated opposite to a surface facing the interposer substrate 31. The conductive polymer capacitor 40 uses an anodic oxide film of a valve metal foil 41.

A conductive polymer layer 42 made of π-conjugated conductive polymer such as polypyrrole or polyethylenedioxythiophene is formed on a surface of a dielectric which is the oxide film formed on the valve metal foil (valve metal part) 41 such as aluminum (Al), tantalum (Ta), or niobium (Nb) by anodic oxidation, so that the conductive polymer capacitor 40 is formed. The conductive polymer layer 42 as a conductive part is a cathode of the capacitor 40. An anode of the capacitor 40 is the valve metal foil 41 as a mother body.

For example, in a case where an aluminum (Al) foil is used as the valve metal foil 41, an anodic oxidization process is implemented in an aqueous solution of ammonium adipate, ammonium pentaborate, or the like. An oxide film ($Al_2O_3$) formed by anodic oxidation is used as a dielectric. The conductive polymer layer 42 formed on a surface of the dielectric is used as a cathode of the capacitor 40. An aluminum (Al) foil is used as an anode of the capacitor 40.

Before the anodic oxidization process of aluminum (Al), an etching process such as an electrolytic etching process may be implemented on a surface of the aluminum (Al) foil so that a porous structure may be formed.

Figure 4:
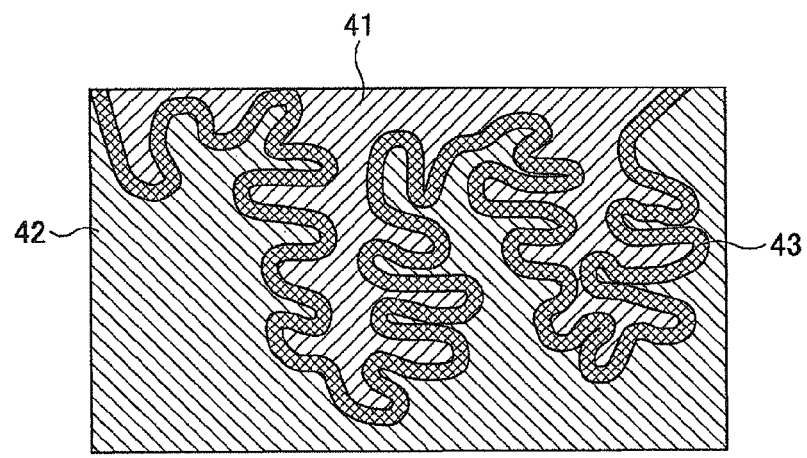
FIG. 4 is a view of a part surrounded by a dotted line A in FIG. 3, showing an interface of valve metal foil and a conductive polymer film.

FIG. 4 shows an interface of the valve metal foil 41 and the conductive polymer layer 42 at a part surrounded by a dotted line A in FIG. 3. As shown in FIG. 4, before the anodic oxidization processing of aluminum (Al), an etching process such as an electrolytic etching process is implemented on a surface of the aluminum (Al) foil 41 so that a porous structure is formed where concave parts 43 are formed. Due to the concave parts 43, it is possible to increase a forming area (effective surface area) of the oxide film ($Al_2O_3$). As a result of this, it is possible to increase the capacitance of the capacitor 40.

As discussed above, niobium (Nb) may be used as a dielectric material of the capacitor 40. The dielectric constant of niobium oxide is approximately 42 and greater than the dielectric constant of aluminum oxide (approximately 8). Hence, it is possible to achieve large capacitance of the capacitor.

Referring back to FIG. 3, the conductive polymer film 42 and the valve metal foil 41 of the conductive polymer capacitor 40 are greater in size than the semiconductor element 32 and have configurations overhanging the semiconductor element 32. In addition, the conductive polymer film 42 of the conductive polymer capacitor 40 and a main surface of the semiconductor element 32 facing the conductive polymer film 42 are adhered to each other via, for example, a silver (Ag) paste or heat conductive paste.

In a case where the valve metal foil 41 of the conductive polymer capacitor 40 is made of, for example, aluminum (Al), the conductive polymer capacitor 40 works as not only the capacitor but also a heat radiator of the semiconductor element 32. Accordingly, the heat conductive paste is used for adhering the conductive polymer film 42 of the conductive polymer capacitor 40 and a main surface of the semiconductor element 32 facing the conductive polymer film 42 to each other, so that the heat radiation rate of the semiconductor element 32 can be improved.

Figure 5:
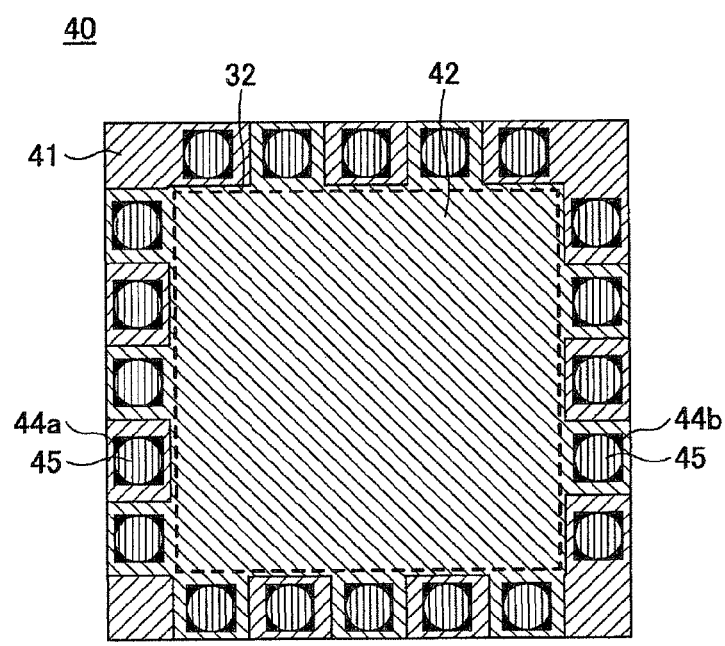
FIG. 5 is a view of a conductive polymer capacitor shown in FIG. 3 seen from a semiconductor element side.

FIG. 5 is a view showing the conductive polymer 40 seen from a semiconductor element 32 side. In FIG. 5, a dotted line indicates a part of the semiconductor element 32 adhered to the conductive polymer capacitor 40.

As shown in FIG. 5, the conductive polymer film 42 is partially formed on the valve metal foil 41 of the conductive polymer capacitor 40 having a rectangular-shaped main surface. In addition, plural electrode pads 44 are formed along four sides of an outer periphery of the conductive polymer capacitor 40. More specifically, electrode pads 44a are formed in the vicinity of the outer periphery of the valve metal foil 41. Electrode pads 44b are formed in the vicinity of the outer periphery of the conductive polymer film 42. The electrode pads 44a and the electrode pads 4b are made of at least one of, for example, silver paste and carbon paste.

Referring back to FIG. 3, the electrode pads 44a of the conductive polymer capacitor 40 and electrode pads 38b situated outside of the electrode pads 38a on the upper surface of the interposer substrate 31 are coupled to each other by solder bumps 45. Under this structure, the conductive polymer capacitor 40 is coupled an electric power source voltage line and a ground line (not shown in FIG. 3) of the interposer substrate 31 so as to be electrically coupled an electric power source electrode and a ground electrode of the semiconductor element 32.

More specifically, the electrode pad 44a formed on the valve metal foil 41 which is an anode of the conductive polymer capacitor 40 is coupled to the electric power source voltage line (not shown in FIG. 3) of the interposer substrate 31 by the corresponding solder bump 45. The electrode pad 44b formed on the conductive polymer film 42 which is a cathode of the conductive polymer capacitor 40 is coupled to the ground line (not shown in FIG. 3) of the interposer substrate 31 by the corresponding solder bump 45.

In addition, an underfill material 36 whose main ingredient is epoxy resin is supplied between the semiconductor element 32 and the interposer substrate 31, so that the connection between the semiconductor element 32 and the interposer substrate 31 is reinforced. In addition, an underfill material 47 whose main ingredient is epoxy resin is supplied between the conductive polymer capacitor 40 and the interposer substrate 31, so that the connection between the conductive polymer capacitor 40 and the interposer substrate 31 is reinforced.

In the interposer substrate 31, the bonding wire 39 coupled to a package substrate (not shown in FIG. 3) is coupled to the electrode pad 38c. The bonding wire 39 works as a path configured to supply electric power to the semiconductor element 32. The bonding wire 39 is coupled to a wiring layer in the interposer substrate 31 via the electrode pad 38c and coupled to the electric power source electrode and the ground electrode of the semiconductor element 32 via the wiring layer. However, the path of the electric power to the semiconductor element 32 is not limited to the above-discussed example. A via forming part may be formed in the interposer substrate 31 and the package substrate (not shown in FIG. 3) situated under the interposer substrate 31 and the interposer substrate 31 may be coupled to each other.

Thus, in the semiconductor device 30, the semiconductor element 32 is coupled to the interposer substrate 31 via the micro bumps 35 and the conductive polymer capacitor 40 is provided on the semiconductor element 32. In addition, the conductive polymer capacitor 40 is coupled to the interposer substrate 31 via the solder bumps 45.

Under this structure, the large capacitance capacitor 40 is provided in the vicinity of the semiconductor element 32. Accordingly, it is possible to realize a semiconductor device having a capacitor which can flow large electric current with a simple structure.

In the capacitor 40, the oxidization film formed on the valve metal foil 41 by anodic oxidization is used as a dielectric. The conductive polymer film 42 is formed on the surface of the oxidization film. Accordingly, it is not necessary to use large size vacuum equipment such as a sputtering apparatus or a dry etching apparatus in order to form the capacitor 40. Hence, it is possible to manufacture the semiconductor device 30 having the capacitor 40 at low cost.

Furthermore, since a mother body metal of the capacitor 40 is a valve metal such as aluminum (Al), the capacitor 40 works as not only a capacitor but also a heat radiator of the semiconductor element 32.

In the meantime, in the above-discussed example, as shown in FIG. 3 and FIG. 5, the main surface of the conductive polymer capacitor 40 is greater than the semiconductor element 32. However, the embodiment is not limited to this example. The embodiment can be applied to an example shown in FIG. 6.

Figure 6:
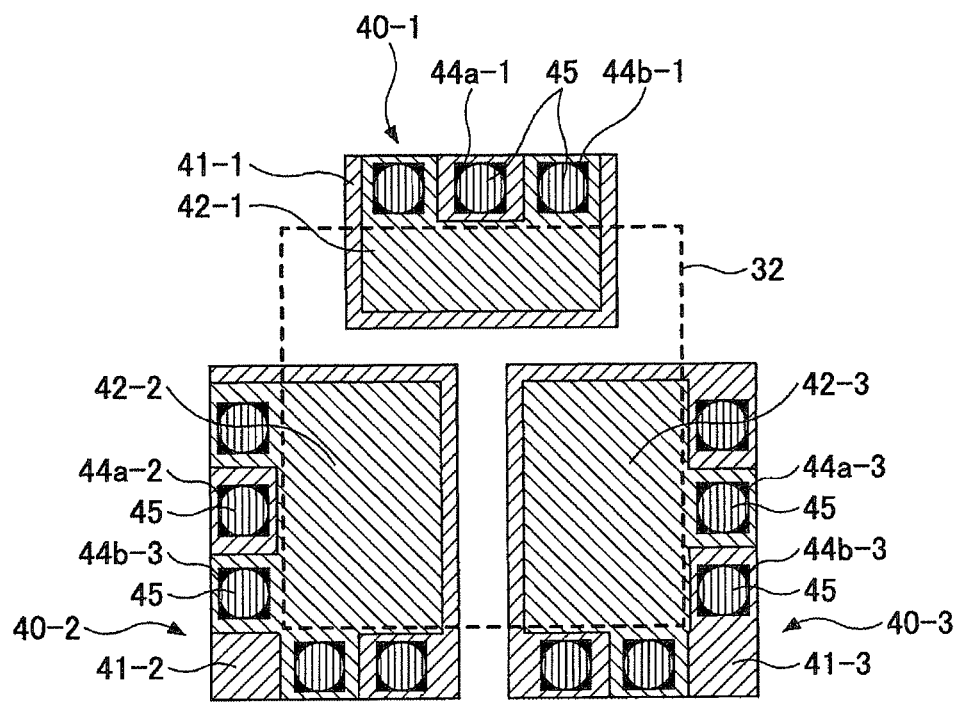
FIG. 6 is a view showing a modified example of the conductive polymer capacitor shown in FIG. 3.

FIG. 6 is a view showing a modified example of the conductive polymer capacitor shown in FIG. 3 seen from a semiconductor element 32 (see FIG. 3) side. In FIG. 6, a dotted line indicates an arrangement area of the semiconductor element 32 adhered to the conductive polymer capacitors.

In the example shown in FIG. 6, conductive polymer capacitors 40-1 through 40-3 are provided partially along the outer periphery of the semiconductor element 32. The conductive polymer capacitors 40-1 through 40-3 have main surfaces smaller than the conductive polymer capacitor 40 shown in FIG. 3 and substantially same structures as that of the conductive polymer capacitor 40 shown in FIG. 3. In other words, each of the conductive polymer capacitors 40-1 through 40-3 has the valve metal foil 41, the conductive polymer film 42, and the electrode pads 44a and 44b.

Thus, according to this example, it is possible to arrange plural capacitors 40-1 through 40-3 corresponding to required capacitance in the vicinity of the semiconductor element 32.

In addition, although a single semiconductor element 32 is mounted on a single interposer substrate 31 in the example shown in FIG. 3 and FIG. 6, the embodiment is not limited to this example. The embodiment can be applied to an example like the semiconductor device 70 shown in FIG. 7 where plural semiconductor elements are mounted on a single interposer substrate 31.

Figure 7:
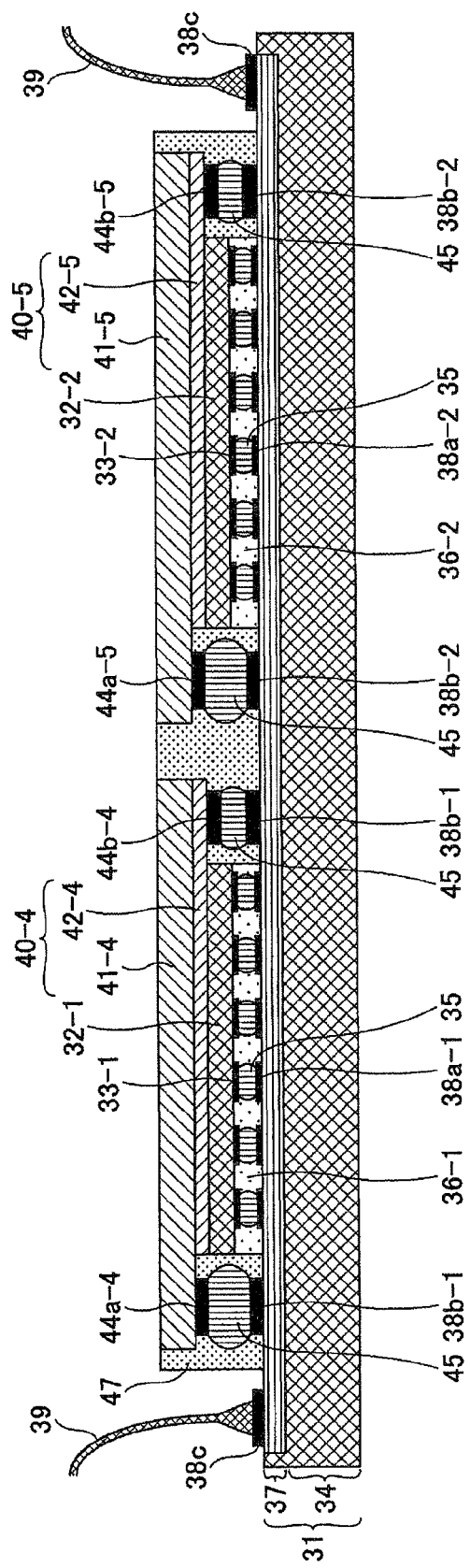
FIG. 7 is a cross-sectional view of a modified example of the semiconductor device shown in FIG. 3.

FIG. 7 is a cross-sectional view of a modified example of the semiconductor device shown in FIG. 3. In FIG. 7, parts that are the same as the parts shown in FIG. 3 are given the same reference numerals, and explanation thereof is omitted.

In an example shown in FIG. 7, a first semiconductor element 32-1 and a second semiconductor element 32-2 are mounted on a single interposer substrate 31 in a face-down manner by a flip chip method. The first semiconductor element 32-1 is, for example, a storage element such as a DRAM (Dynamic Random Access Memory) or a flash memory. The second semiconductor element 32 is, for example, a logic circuit element such as a microprocessor.

Micro bumps 35 as convex shaped outside connection terminals made of, for example, solder are provided between outside connection pads 33-1 of the first semiconductor element 32-1 and electrode pads 38a-1 of the interposer substrate 31. The micro bumps 35 are provided between outside connection pads 33-2 of the second semiconductor element 32-2 and electrode pads 38a-2 of the interposer substrate 31.

In addition, an underfill material 36-1 whose main ingredient is epoxy resin is supplied between the first semiconductor element 32-1 and the interposer substrate 31 so that connection between the first semiconductor element 32-1 and the interposer substrate 31 is reinforced. An underfill material 36-2 whose main ingredient is epoxy resin is supplied between the second semiconductor element 32-2 and the interposer substrate 31 so that connection between the second semiconductor element 32-2 and the interposer substrate 31 is reinforced.

Plane-shaped (sheet) conductive polymer capacitors 40-4 and 40-5 are provided on a main surface of the first semiconductor element 32-1 and the second semiconductor element 32-2, respectively, situated opposite to a surface facing the interposer substrate 31. The conductive polymer capacitors 40-4 and 40-5 use the anodic oxide film of the valve metal.

The first semiconductor element 32-1, the second semiconductor element 32-2, and the conductive polymer capacitors 40-4 and 40-5 are situated at a center part of the interposer substrate 31 as compared to the electrode pad 38c of the interposer substrate 31 where the bonding wire 39 is coupled.

The conductive polymer films 42-4 and 42-5 of the conductive polymer capacitors 40-4 and 40-5 and surfaces of the first semiconductor element 32-1 and the second semiconductor element 32-2 facing the interposer substrate 31 are adhered to each other via silver paste and heat conductive paste.

The electrode pads 44a-4 and 44b-4 of the conductive polymer capacitor 40-4 and the electrode pads 38b-1 of the interposer substrate 31 are coupled to each other by the solder bumps 45. In addition, the electrode pads 44a-5 and 44b-5 of the conductive polymer capacitor 40-5 and the electrode pads 38b-2 of the interposer substrate 31 are coupled to each other by the solder bumps 45.

Under this structure, the conductive polymer capacitors 40-4 and 40-5 are coupled to an electric power source voltage line and a ground line (not shown in FIG. 7) of the interposer substrate 31 so as to be electrically coupled to an electric power source electrode and a ground electrode of the first semiconductor element 32-1 and the second semiconductor element 32-2.

In addition, an underfill material 47 whose main ingredient is epoxy resin is supplied between the conductive polymer capacitors 40-4 and 40-5 and the interposer substrate 31, so that the connection between the conductive polymer capacitors 40-4 and 40-5 and the interposer substrate 31 is reinforced.

Thus, plural semiconductor elements 32-1 and 32-2 are mounted on a single interposer substrate 31. The conductive polymer capacitors 40-4 and 40-5 are mounted on the semiconductor elements 32-1 and 32-2.

According to the above-discussed example, since plural semiconductor elements 32-1 and 32-2 are mounted on a single interposer substrate 31, it is possible to perform high speed signal transferring of several Gbps between the semiconductor elements 32-1 and 32-2. In addition, it is possible to arrange the capacitors 40-4 and 40-5 corresponding to necessary capacitances in the vicinities of the first semiconductor element 32-1 and the second semiconductor element 32-2.

2. Manufacturing Method of the Semiconductor Device

Next, a manufacturing method of the semiconductor device of the above-discussed embodiment is disclosed.

Figure 8:
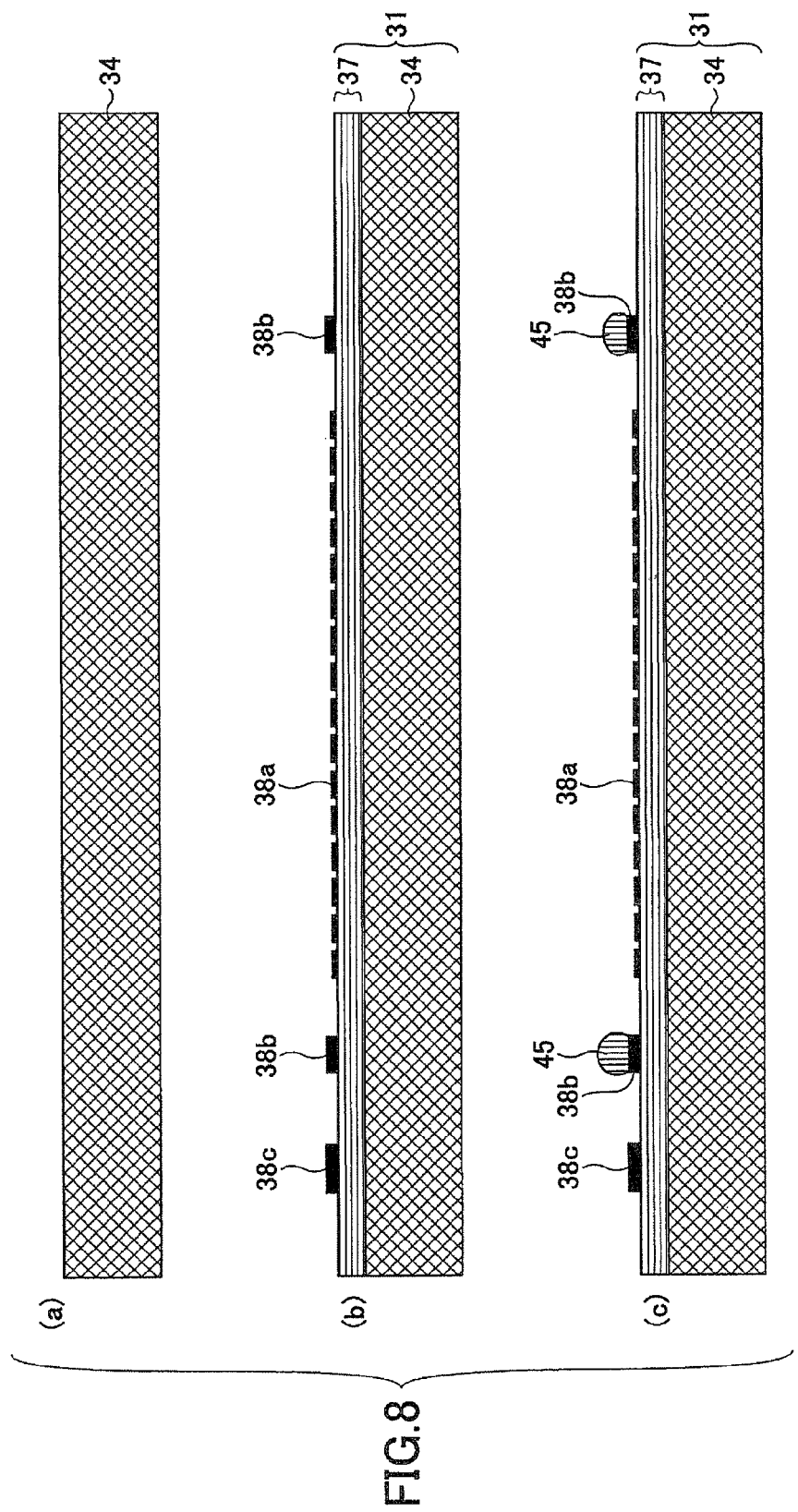
FIG. 8 is a first view for explaining a manufacturing method of the semiconductor device shown in FIG. 3.
Figure 9:
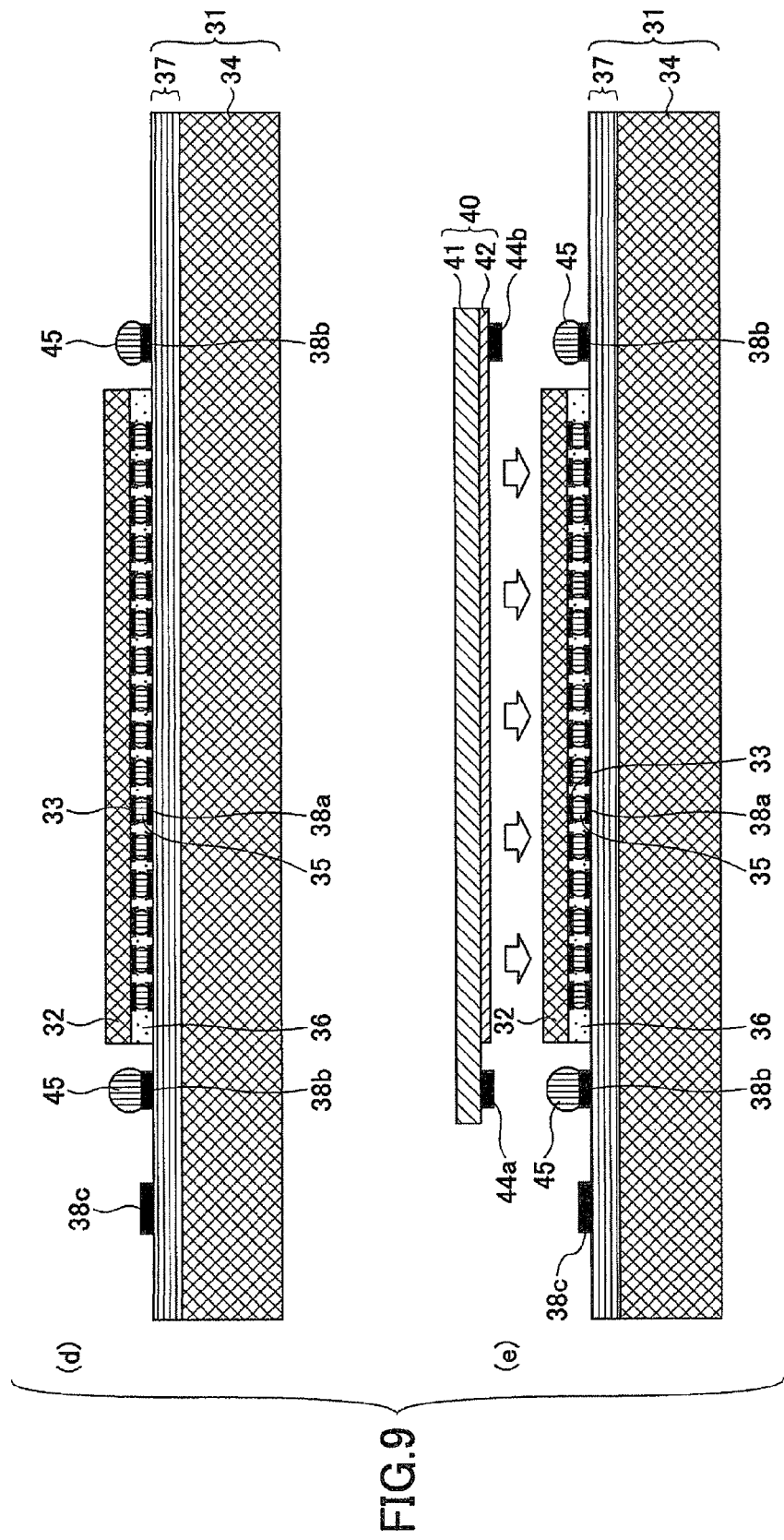
FIG. 9 is a second view for explaining the manufacturing method of the semiconductor device shown in FIG. 3.
Figure 10:
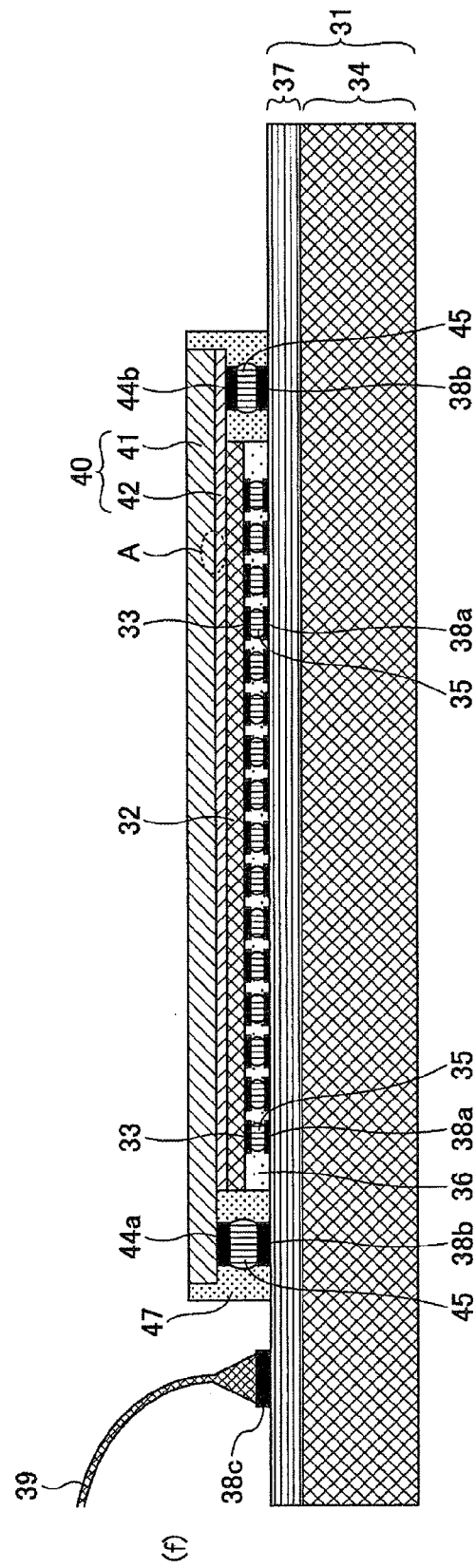
FIG. 10 is a third view for explaining the manufacturing method of the semiconductor device shown in FIG. 3.

FIG. 8 through FIG. 10 are first through third views for explaining a manufacturing method of the semiconductor device 30.

As shown in FIG. 8(*a*), a substrate made of silicon (Si) is prepared. Then, as shown in FIG. 8(*b*), the multilayer micro wiring structure 37 is formed on the upper surface of the silicon (Si) substrate 34. The multilayer micro wiring structure 37 is formed by stacking plural wiring layers made of copper (Cu) or the like via insulation films made of polyimide or the like.

In addition, as shown in FIG. 8(*b*), the electrode pads 38 are formed on the multilayer micro wiring structure 37. More specifically, each electrode pad 38 is formed by the following method. That is, titanium (Ti) and copper (Cu) are formed in a film by sputtering deposition. Nickel (Ni) is plated by using the sputtering film made of titanium (Ti) and copper (Cu) as a seed layer so that the electrode pad 38 is formed.

In a step disclosed below, plural electrode pads formed at a center side of the upper surface of the interposer substrate 31 are coupled to the outside connection pads 33 (see FIG. 3) of the semiconductor element 32 via the micro bumps 35. In a step discussed below, plural electrode pads 38b formed outside the electrode pads 38a are coupled to the electrode pads 44 (see FIG. 3) of the conductive polymer capacitor 40 via the solder bumps 45. In a step disclosed below, the bonding wire 39 is coupled to the electrode pad 38c formed outside the electrode pads 38b.

Thus, the interposer substrate 31 shown in FIG. 3 is formed.

Next, as shown in FIG. 8(*c*), the solder bumps 45 whose main ingredient is tin (Sn) are formed on the electrode pads 38b of the interposer substrate 31. As shown in FIG. 9(*d*), the semiconductor element 32 is mounted on the interposer substrate 31 in a face-down manner by a flip-chip method.

The semiconductor element 32 is a semiconductor integrated circuit element using a silicon (Si) semiconductor substrate and formed by known semiconductor manufacturing processes. Plural outside connection pads 33 made of aluminum (Al), copper (Cu), and alloys of these metals are formed on a main surface of the semiconductor substrate.

For mounting the semiconductor element 32 on the interposer substrate 31, the micro bumps 35 which are the convex shaped outside connection terminals made of solder whose main ingredient is, for example, tin (Sn) are formed on the electrode pads 38a of the interposer substrate 31. The electrode pads 38a of the interposer substrate 31 and the outside connection pads 33 of the semiconductor element 32 are coupled to each other via the micro bumps 35.

In addition, the underfill material 36 whose main ingredient is epoxy resin is supplied between the semiconductor element 32 and the interposer substrate 31, so that the connection between the semiconductor element 32 and the interposer substrate 31 is reinforced.

Next, as shown in FIG. 9(*e*), a plane-shaped (sheet) conductive polymer capacitor 40 is provided on a main surface of the semiconductor element 32 situated opposite to a surface facing the interposer substrate 31. The conductive polymer capacitor 40 uses the anodic oxide film of the valve metal.

As discussed above, the conductive polymer layer 42 made of π-conjugated conductive polymer such as polypyrrole or polyethylenedioxythiophene is formed on a surface of a dielectric which is an oxide film formed on the valve metal foil (valve metal part) 41 such as aluminum (Al), tantalum (Ta), or niobium (Nb) by anodic oxidization, so that the conductive polymer capacitor 40 is formed. The conductive polymer layer 42 as a conductive part is a cathode of the capacitor 40. An anode of the capacitor 40 is the valve metal foil 41 as a mother body. For forming the conductive polymer film 42, a mask protects a part forming the anode of the capacitor 40.

For example, in a case where an aluminum (Al) foil is used as the valve metal foil 41, an anodic oxidization process is implemented in an aqueous solution of ammonium adipate, ammonium pentaborate, or the like. An oxide film ($Al_2O_3$) formed by anodic oxidization is used as a dielectric. The conductive polymer layer 42 formed on a surface of the dielectric is used as a cathode of the capacitor 40. An aluminum (Al) foil is used as an anode of the capacitor 40.

As discussed with reference to FIG. 4, before the anodic oxidization process of aluminum (Al), an etching process such as an electrolytic etching process may be implemented on a surface of the aluminum (Al) foil so that a porous structure with concave parts 43 is formed. Due to the concave parts 43 formed by the etching process such as the electrolytic etching process on the surface of the aluminum (Al) foil 41, it is possible to increase a forming area (effective surface area) of the oxide film ($Al_2O_3$). As a result of this, it is possible to increase the capacitance of the capacitor 40.

In addition, by using a printing method using at least one of, for example, a silver paste and a carbon paste, the electrode pad 44a is formed in the vicinity of the outer periphery of the valve metal foil 41 and the electrode pad 44b is formed in the vicinity of the conductive polymer film 42.

The conductive polymer film 42 of the conductive polymer capacitor 40 and a main surface of the semiconductor element 32 facing the conductive polymer film 42 are adhered to each other by a heat conductive adhesive paste wherein, for example particle, a silver paste or a aluminum nitride is a filler, so that the conductive polymer capacitor 40 is provided on the semiconductor element 32.

The electrode pad 44 of the conductive polymer capacitor 40 and the electrode pad 38b of the interposer substrate 31 are coupled to each other by the solder bump 45 whose main ingredient is tin (Sn). Thus, the conductive polymer capacitor 40 is coupled to an electric power source voltage line and a ground line (not shown) of the interposer substrate 31 so as to be electrically coupled to an electric power source electrode and a ground electrode of the semiconductor element 32.

After that, as shown in FIG. 10(f), the underfill material 47 whose main ingredient is epoxy resin is supplied between the conductive polymer capacitor 40 and the interposer substrate 31 so that the connection between the conductive polymer capacitor 40 and the interposer substrate 31 is reinforced.

In addition, the bonding wire 39 coupled to the package substrate (not shown) is coupled to the electrode pad 38c of the interposer substrate 31, so that the semiconductor device 30 having the conductive polymer capacitor 40 is completed.

Figure 11:
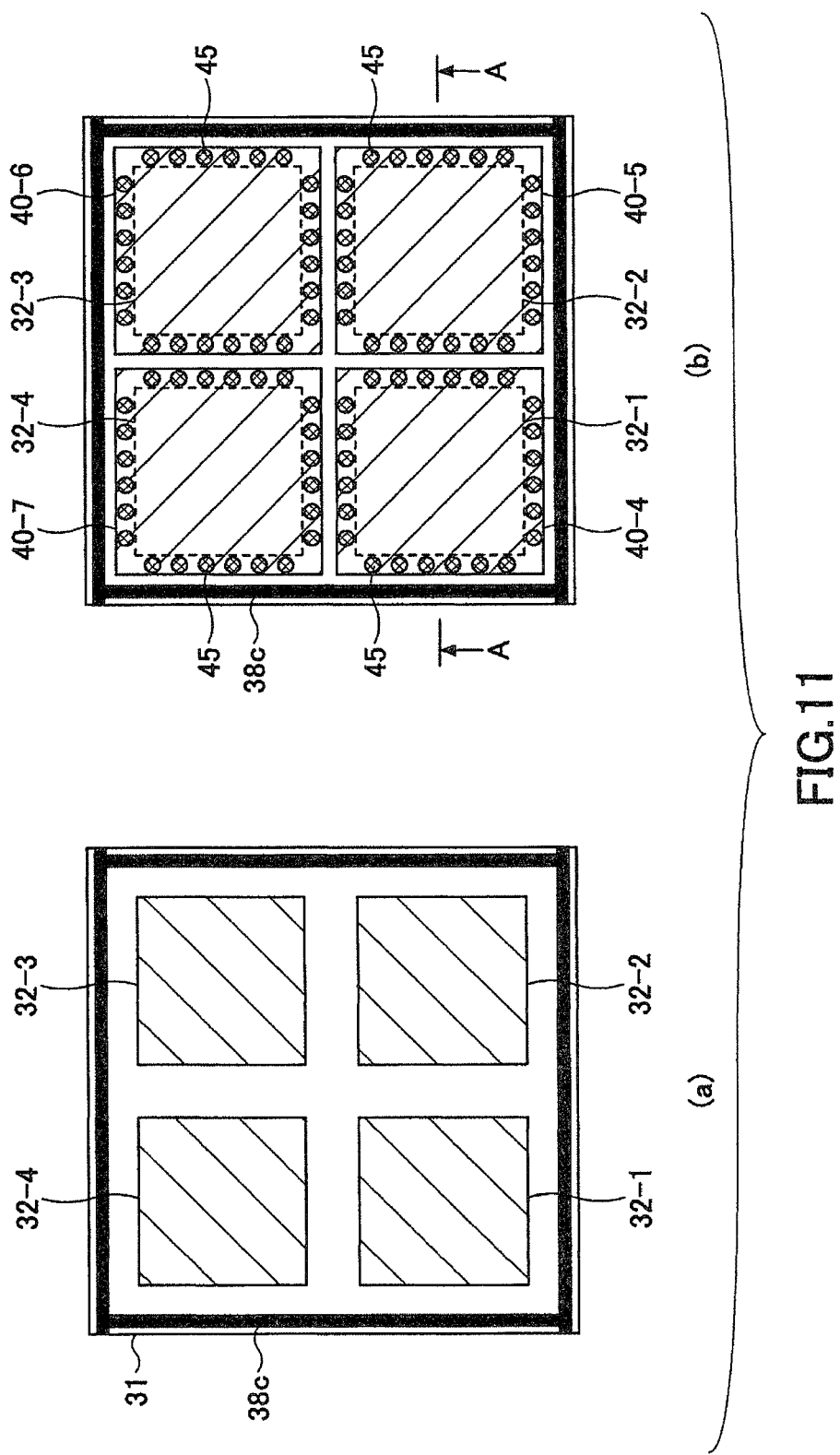
FIG. 11 is a view for explaining a manufacturing method of the semiconductor device shown in FIG. 7.

In addition, the semiconductor device 70 shown in FIG. 7 can be manufactured by a method shown in FIG. 11. FIG. 11 is a plan view for explaining a manufacturing method of the semiconductor device 70 shown in FIG. 7. A cross sectional view taken along a line A-A in FIG. 11(b) corresponds to FIG. 7.

For manufacturing the semiconductor device 70 shown in FIG. 7, by steps shown in FIG. 8(a) through FIG. 9(d), the semiconductor elements 32-1 through 32-4 are mounted at the center of the interposer substrate 31, as compared to the electrode pad 38c on the interposer substrate 31, in a face down manner by the flip chip method (see FIG. 11(a)). Furthermore, the underfill material 36 whose main ingredient is epoxy resin is supplied between the interposer substrate 31 and the semiconductor elements 32-1 through 32-4 so that the connection between the interposer substrate 31 and the semiconductor elements 32-1 through 32-4 is reinforced.

Plane-shaped (sheet) conductive polymer capacitors 40-4 and 40-5 are provided on a main surface of the first semiconductor element 32-1 and the second semiconductor element 32-2 situated opposite to a surface facing the interposer substrate 31. The conductive polymer capacitors 40-4 and 40-5 use the anodic oxide film of the valve metal. In addition, the electrode pads 44a and 44b (see FIG. 7) of the conductive polymer capacitors 40-4 through 40-7 and the electrode pads 38b (see FIG. 7) of the interposer substrate 31 are coupled to each other via the solder bumps 45.

In addition, the underfill material 47 whose main ingredient is epoxy resin is supplied between the conductive polymer capacitors 40-4 through 40-7 and the interposer substrate 31 so that the connection between the conductive polymer capacitors 40-4 through 40-7 and the interposer substrate 31 is reinforced.

Thus, the semiconductor device 70 having a structure where plural semiconductor elements 32-1 through 32-4 are provided on a single interposer substrate 31 and the conductive polymer capacitors 40-4 through 40-7 are provided on the semiconductor elements 32-1 through 32-4 is completed.

In the meantime, the inventors performed the following examples so that the semiconductor device of the embodiment could be manufactured.

Example 1

In an example 1, first of all, the conductive polymer capacitor was manufactured by the following steps. A porous structure is formed in a surface of aluminum (Al) foil having thickness of 0.07 mm by electrolytic etching. The aluminum (Al) foil is cleaned by hydrofluoro-nitric acid and distilled water. Then, anodic oxidization was made in a water solution where 150 g of ammonium adipate was dissolved in 1000 ml of pure water so that aluminum oxide film was formed. The liquid temperature at the time of anodic oxidization was 85° C., formation voltage was 100 V, electrical current of 0.3 A flowed, and the voltage applying time was 20 minutes.

After that, a solution containing polyethylenedioxythiophene and styrene sulfonate was applied to the surface of the anodic oxidization film and the surface was dried. At this time, a part which works as a cathode of the capacitor was protected by a mask. This step was repeated two times so that the conductive polymer film which works as a cathode of the capacitor had the film thickness of 15 μm.

Next, at least one of the silver (Ag) paste or the carbon paste was applied to the anode and cathode of the capacitor by a printing method so that an electrode pad was formed.

On the other hand, the interposer substrate was manufactured by the following steps.

In other words, a substrate made of silicon (Si) was prepared. A multi layer micro wiring structure was formed on the silicon (Si) substrate. The multi layer micro wiring structure was formed by stacking three layers of micro wiring made of copper (Cu) and insulation films made of polyimide or the like.

Via posts made of copper (Cu) were formed in portions corresponding to electrode pads coupled to the outside connection pads of the semiconductor device via the micro bumps, electrode pads coupled to the electrode pads of the conductive polymer capacitor, and the electrode pad where the bonding wire 39 is coupled. After that, titanium (Ti) film was formed by sputtering so as to have the film thickness of 0.5 μm. Then, a copper (Cu) film was formed by sputtering so as to have the film thickness of 0.5 μm. After opening parts were made in the photo resist corresponding to the electrode pads, a copper (Cu) film situated other than on the electrode pads was etched and removed. Then, a nickel (Ni) layer was plated by using a copper (Cu)/titanium (Ti) layer formed by sputtering as a seed layer so as to have the film thickness of 5 μm. After the resist was removed, the titanium (Ti) film was etched and removed.

Thus, the electrode pads coupled to the outside connection pads of the semiconductor device via the micro bumps, the electrode pads coupled to the electrode pads of the conductive polymer capacitors, and the electrode pad where the bonding wire is coupled were formed.

Resist deposition was made by using the electrode pads coupled to the electrode pads of the conductive polymer capacitors as opening parts so that solder plating (Sn—Bi) was applied on the electrode pads. Thus, the interposer substrate having the silicon (Si) substrate was manufactured.

Next, the semiconductor element was mounted on the interposer substrate in a face-down manner by the flip chip method. In other words, the micro bumps made of solder containing, for example, tin-silver (Sn—Ag) were formed on the electrode pads of the interposer substrate. The electrode pads of the interposer substrate were coupled to the outside connection pads of the semiconductor element by the micro bumps.

After that, the conductive polymer film of the conductive polymer capacitor and the main surface of the semiconductor element facing the conductive polymer film were adhered by the silver paste so that the conductive polymer capacitor was mounted on the semiconductor element. The electrode pads of the anodes and cathodes of the capacitor and the electrode pads of the interposer substrate were coupled to each other by the solder bumps whose main ingredient was tin (Sn) so that the semiconductor device having the conductive polymer capacitor could be manufactured.

The inventor also manufactured a conductive polymer capacitor using a niobium (Nb) foil as a dielectric material for the capacitor. Then, the conductive polymer capacitor was provided on the semiconductor device and coupled to the interposer substrate, and thereby the semiconductor device was manufactured.

First, the conductive polymer capacitor was manufactured by the following steps.

After the niobium (Nb) foil having the thickness of 0.1 mm was cleaned by acid and distilled water, anodic oxidization was made in a phosphoric acid solution so that a niobium oxide film was formed. The liquid temperature at the time of anodic oxidization was 90° C., formation voltage was 150 V, electrical current of 0.6 A flowed, and the voltage applying time was 10 minutes. The niobium oxidization film works as a cathode of the capacitor.

Thus, the conductive polymer capacitor is provided on the semiconductor element and coupled to the interposer substrate so that the semiconductor device having the conductive polymer capacitor is formed.

Example 2

The inventors also performed the following example 2 so that the semiconductor device of the embodiment could be manufactured.

In an example 2, first of all, the conductive polymer capacitor was manufactured by the following steps.

A porous structure was formed in a surface of aluminum (Al) foil having thickness of 0.1 mm by electrolytic etching. The aluminum (Al) foil is cleaned by hydrofluoro-nitric acid and distilled water. Then, anodic oxidization was made in a water solution where 150 g of ammonium adipate was dissolved in 1000 ml of pure water so that aluminum oxide film was formed. The liquid temperature at the time of anodic oxidization was 85° C., formation voltage was 100 V, electrical current of 0.3 A flowed, and the voltage applying time was 20 minutes.

After that, a solution containing polypyrrole was applied to the surface of the anodic oxidization film and the surface was dried. At this time, a part which works as a cathode of the capacitor was protected by a mask. This step was repeated five times so that the conductive polymer film which works as a cathode of the capacitor had the film thickness of 50 µm.

Next, at least one of the silver (Ag) paste was applied to the anode and cathode of the capacitor by a printing method so that an electrode pad was formed.

On the other hand, the interposer substrate was manufactured by the steps the same as those in the example 1.

Next, the semiconductor element was mounted on the interposer substrate in a face-down manner by the flip chip method. In other words, the micro bumps made of solder containing, for example, tin-silver (Sn—Ag) were formed on the electrode pads of the interposer substrate. The electrode pads of the interposer substrate were coupled to the outside connection pads of the semiconductor element by the micro bumps.

After that, the conductive polymer film of the conductive polymer capacitor and the main surface of the semiconductor element facing the conductive polymer film were adhered by a heat conductive adhesive so that the conductive polymer capacitor was mounted on the semiconductor element. In the heat conductive adhesive in this example, a nitride of aluminum having a heat conductivity rate of 15 W/mK is used as a filler particle. The electrode pads of the anodes and cathodes of the capacitor and the electrode pads of the interposer substrate were coupled to each other by the solder bumps whose main ingredient was tin (Sn).

Thus, the semiconductor device having the conductive polymer capacitor is completed.

Thus, according to the manufacturing method of the semiconductor device of the embodiment, the oxidization film formed on the valve metal foil by anodic oxidization is used as a dielectric. The conductive polymer film is formed on the surface of the oxidization film so that the capacitor is formed. The capacitor is provided on the semiconductor element so as to be coupled to the interposer substrate and thereby the semiconductor device is formed.

Accordingly, it is not necessary to use large size vacuum equipment such as a sputtering apparatus or a dry etching apparatus in order to form the capacitor. Hence, it is possible to manufacture the semiconductor device having the capacitor at low cost.

Although the invention has been described with respect to specific embodiments for a complete and clear disclosure, the appended claims are not to be thus limited but are to be construed as embodying all modifications and alternative constructions that may occur to one skilled in the art that fairly fall within the basic teachings herein set forth.

This patent application is based on Japanese Priority Patent Application No. 2007-226592 filed on Aug. 31, 2007, the entire contents of which are hereby incorporated herein by reference.

What is claimed is:

1. A manufacturing method of a semiconductor device, comprising:
   forming a concave part in a valve metal by etching;
   performing anodic oxidization on the valve metal to form an anodic oxide film in the concave part;
   forming a capacitor by forming a conductive part made of a conductive material on the anodic oxide film;
   adhering the capacitor on a semiconductor element mounted on a supporting substrate such that the conductive part faces the semiconductor element and overhangs the semiconductor element; and
   coupling the capacitor to the supporting substrate using an outside connection terminal.

2. The manufacturing method of the semiconductor device as claimed in claim 1,
   wherein the conductive material is made of conductive polymers; and
   the conductive part of the capacitor is formed by applying the conductive material on the anodic oxide film.

3. The manufacturing method of the semiconductor device as claimed in claim 1, further comprising:
   coupling the supporting substrate and a circuit substrate where the supporting substrate is mounted to each other by a bonding wire.

4. A manufacturing method of a semiconductor device, comprising:
   forming a concave part in a valve metal by etching;
   performing anodic oxidization on the valve metal to form an anodic oxide film in the concave part;
   forming a capacitor by forming a conductive part made of a conductive material on the anodic oxide film;
   adhering the capacitor on a semiconductor integrated circuit device mounted on a supporting substrate such that the conductive part faces the semiconductor element and overhangs the semiconductor integrated circuit device; and coupling the capacitor to the supporting substrate using an outside connection terminal.

* * * * *